United States Patent
Vester et al.

(10) Patent No.: US 9,465,092 B2
(45) Date of Patent: Oct. 11, 2016

(54) RECEIVING METHOD, RECEIVING SYSTEM FOR MAGNETIC RESONANCE SIGNALS, AND MAGNETIC RESONANCE IMAGING SYSTEM

(71) Applicants: Markus Vester, Nuremberg (DE); Jian Min Wang, Shenzhen (CN); Lan Wang, Shenzhen (CN); Zhi Bin Li, Shenzhen (CN)

(72) Inventors: Markus Vester, Nuremberg (DE); Jian Min Wang, Shenzhen (CN); Lan Wang, Shenzhen (CN); Zhi Bin Li, Shenzhen (CN)

(73) Assignee: Siemens Aktiengesellschaft, München (DE)

( * ) Notice: Subject to any disclaimer, the term of this patent is extended or adjusted under 35 U.S.C. 154(b) by 837 days.

(21) Appl. No.: 13/689,751

(22) Filed: Nov. 29, 2012

(65) Prior Publication Data
US 2013/0134980 A1  May 30, 2013

(30) Foreign Application Priority Data
Nov. 30, 2011  (CN) .......................... 2011 1 0389270

(51) Int. Cl.
| G01V 3/00 | (2006.01) |
| G01R 33/54 | (2006.01) |
| G01R 33/36 | (2006.01) |
| G01R 33/3415 | (2006.01) |

(52) U.S. Cl.
CPC ............ *G01R 33/54* (2013.01); *G01R 33/3621* (2013.01); *G01R 33/3415* (2013.01)

(58) Field of Classification Search
CPC .............. G01R 33/54; G01R 33/3621; G01R 33/3415

USPC ........................................................ 324/322
See application file for complete search history.

(56) References Cited

U.S. PATENT DOCUMENTS

| 5,136,243 A * | 8/1992 | Starewicz | G01R 33/24 324/301 |
| 5,739,691 A * | 4/1998 | Hoenninger, III | G01R 33/3621 324/307 |
| 6,195,031 B1 * | 2/2001 | Feld | H03M 1/188 341/120 |

(Continued)

FOREIGN PATENT DOCUMENTS

| EP | 0107294 A2 * | 5/1984 | G01R 33/3621 |
| EP | 0554584 A1 * | 8/1993 | G01R 33/3415 |

*Primary Examiner* — Benjamin M Baldrige
(74) *Attorney, Agent, or Firm* — Lempia Summerfield Katz LLC

(57) ABSTRACT

A method and system for receiving magnetic resonance signals, and a magnetic resonance imaging system are provided. The method includes dividing coil units in a receiving coil array into different coil unit groups. For each of the coil unit groups, correlations are established between carrier frequencies and the signals received by each coil unit in the coil unit group. Low noise amplification is performed, and filtering and frequency mixing is performed on the signals received by all the coil units in the coil unit group according to the correlations to obtain intermediate frequency signals borne on the respectively corresponding carrier frequencies of an identical channel. After performing amplification and filtering on the intermediate frequency signals, the intermediate frequency signals are output to an analog-to-digital conversion unit to perform digital sampling so as to obtain digital domain signals.

13 Claims, 2 Drawing Sheets

(56) References Cited

U.S. PATENT DOCUMENTS

| | | | |
|---|---|---|---|
| 6,208,297 B1* | 3/2001 | Fattouche | G01S 5/0009 342/450 |
| 6,285,305 B1* | 9/2001 | Feld | H03M 1/188 341/139 |
| 7,750,635 B2* | 7/2010 | Van Helvoort | G01R 33/3415 324/318 |
| 2001/0010465 A1* | 8/2001 | Kuth | G01R 33/3607 324/318 |
| 2003/0076187 A1* | 4/2003 | Oppelt | H04B 1/64 333/14 |
| 2011/0124301 A1* | 5/2011 | Prasidh | G01R 33/3692 455/110 |
| 2012/0029369 A1* | 2/2012 | Icove | G01K 3/14 600/504 |

* cited by examiner

RECEIVING METHOD, RECEIVING SYSTEM FOR MAGNETIC RESONANCE SIGNALS, AND MAGNETIC RESONANCE IMAGING SYSTEM

This application claims the benefit of CN 201110389270.2, filed on Nov. 30, 2011, which is hereby incorporated by reference.

TECHNICAL FIELD

The present embodiments relate to the technical field of magnetic resonance imaging (MRI).

BACKGROUND

In a magnetic resonance imaging system, magnetic resonance (MR) signals are received using receiving coils, and analog-to-digital conversion and digital down-conversion processing are performed on the magnetic resonance signals from the receiving coils using a digital receiver system to obtain corresponding magnetic resonance imaging signals.

In practical applications, a plurality of receiving coils may be set in an array form, and receiving magnetic resonance signals using the receiving coil array may improve the signal-to-noise ratio of the received magnetic resonance signals, and may better meet the requirements of clinical applications. Each receiving coil in the receiving coil array may be referred to as a coil unit of the array.

To obtain corresponding magnetic resonance imaging signals, a digital receiver system may perform low noise amplification, filtering and frequency mixing on the magnetic resonance signals from each coil unit to obtain intermediate frequency signals borne on a certain carrier frequency of one channel. After performing amplification, filtering and compression on the intermediate frequency signals, the intermediate frequency signals are output to an analog-to-digital conversion unit (ADC) to perform digital sampling so as to obtain digital domain signals. Down-conversion processing is performed on the digital domain signals using a digital processing unit such as a data signal processor (DSP) or a field programmable gate array (FPGA).

With the requirements of clinical applications and the development of the technology of receiving coils (e.g., the number of coil units in a receiving coil array is increasing), the signal-to-noise ratio (SNR) and degree of uniformity of the image obtained thereby are correspondingly greatly improved. However, the increase in the number of coil units will increase the number of channels that bear signals and the number of corresponding ADCs, and correspondingly increase the system costs.

SUMMARY AND DESCRIPTION

A method for receiving magnetic resonance signals, a system for receiving magnetic resonance signals, and a magnetic resonance imaging system used for decreasing the number of ADCs when taking full advantage of the sampling rate of the ADC are provided.

The method for receiving magnetic resonance signals includes dividing coil units in a receiving coil array into different coil unit groups. Each coil unit group includes at least one coil unit. For each coil unit group, correlations are established between carrier frequencies and the signals received by each coil unit in the coil unit group. After performing low noise amplification and anti-aliasing filtering on the signals received by all the coil units in the coil unit group, frequency mixing is performed on the anti-aliasing filtered signals to obtain intermediate frequency signals borne on the respectively corresponding carrier frequencies of an identical channel. After amplifying and filtering the intermediate frequency signals, the intermediate frequency signals are output to an analog-to-digital conversion unit to perform digital sampling so as to obtain digital domain signals.

In one embodiment, the dividing of the coil units in a receiving coil array into different coil unit groups includes dividing the coil units in a receiving coil array into different coil unit groups according to the principle of the dynamic range of the receiving signals of each coil unit group being not greater than the dynamic range of the analog-to-digital conversion unit.

In one embodiment, before the outputting to the analog-to-digital conversion unit to perform digital sampling, the method further includes performing compression on the filtered signals using a compression unit, and outputting the compressed signals to the analog-to-digital conversion unit to perform digital sampling.

The dividing of the coil units in a receiving coil array into different coil unit groups includes dividing the coil units in a receiving coil array into different coil unit groups according to the principle of the dynamic range of the receiving signals of each coil unit group being not greater than the dynamic range co-determined by the analog-to-digital conversion unit and the compression unit.

In one embodiment, the dividing of the coil units in a receiving coil array into different coil unit groups includes dividing all the coil units that receive an identical orthogonal signal into the same group.

In one embodiment, the method further includes performing down-conversion processing on the digital domain signals according to the correlations.

In one embodiment, the coil unit group includes three coil units. Before the performing of frequency mixing on the anti-aliasing filtered signals, the method further includes selecting the frequencies of the required local oscillator signals during frequency mixing to make the frequencies of the frequency mixed intermediate frequency signals meet the following relationship:

$$f_L = f_M + f_s/4, f_R = f_M - f_s/4,$$

where $f_s$ is the sampling rate of an analog-to-digital converter, $f_M$ is the frequency of the intermediate frequency signal of the coil unit located in the middle of three coil units, $f_L$ is the frequency of the intermediate frequency signal of the coil unit located in the left of three coil units, and $f_R$ is the frequency of the intermediate frequency signal of the coil unit located in the right of three coil units. The performing of frequency mixing on the anti-aliasing filtered signals includes performing frequency mixing on the anti-aliasing filtered signals using the local oscillator signals with the selected frequencies. After the obtaining of the digital domain signals, the method further includes extracting the digital domain signals, taking the signal at the (4K+1)th sampling point as a merging signal (e.g., CP signal), with the maximum information amount of the signals received by the three coil units and outputting the CP signal, and taking the signal at the (4K+3)th sampling point as a merging signal (e.g., ACP signal), with the minimum information amount of the signals received by the three coil units and outputting the ACP signal. K is an integer greater than or equal to 0.

The system for receiving magnetic resonance signals includes a receiving coil array including at least one coil unit group, and a correlation recording unit used for recording the correlations between carrier frequencies and the signals received by each coil unit in a corresponding coil unit group. The system also includes a low noise amplification, filtering and frequency mixing unit, used for performing frequency mixing on the anti-aliasing filtered signals according to the correlations recorded by the correlation recording unit after performing low noise amplification and anti-aliasing filtering on the signals received by all the coil units in the coil unit group to obtain intermediate frequency signals borne on the respectively corresponding carrier frequencies of an identical channel. The system includes an amplification and filtering unit used for performing amplification and filtering processing on the intermediate frequency signals, and an analog-to-digital conversion unit used for performing digital sampling on the signals processed by the amplification and filtering unit to obtain digital domain signals. In one embodiment, each coil unit group in the receiving coil array includes coil units with the dynamic ranges of the total receiving signals being not greater than the dynamic range of the analog-to-digital conversion unit. In one embodiment, further included between the amplification and filtering unit and the analog-to-digital conversion unit is a compression unit used for compressing the signals from the amplification and filtering unit, and outputting the compressed signals to the analog-to-digital conversion unit to perform digital sampling.

Each coil unit group of the receiving coil array includes coil units with the dynamic ranges of the total receiving signals being not greater than the dynamic range co-determined by the analog-to-digital conversion unit and the compression unit.

In one embodiment, each coil unit group of the receiving coil array includes all the coil units that receive an identical orthogonal signal.

In one embodiment, the system further includes a digital processing unit used for performing down-conversion processing on the digital domain signals according to the correlations recorded by the correlation recording unit.

In one embodiment, the coil unit group includes three coil units. The system further includes a local oscillator signal frequency determination unit and a digital processing unit (406). The local oscillator signal frequency determination unit, used for selecting the frequencies of the required local oscillator signals during frequency mixing to make the frequencies of the frequency mixed intermediate frequency signals, meets the following relationship:

$$f_L = f_M + f_s/4, f_R = f_M - f_s/4,$$

where $f_s$ is the sampling rate of an analog-to-digital converter, $f_M$ is the frequency of the intermediate frequency signal of the coil unit located in the middle of the three coil units, $f_L$, is the frequency of the intermediate frequency signal of the coil unit located in the left of the three coil units, and $f_R$ is the frequency of the intermediate frequency signal of the coil unit located in the right of the three coil units. The low noise amplification, filtering and frequency mixing unit performs frequency mixing on all the signals received by the group of coil units using the local oscillator signals with the selected frequencies. The digital processing unit is used for extracting the digital domain signals, taking the signal at the (4K+1)th sampling point as a merging signal (e.g., CP signal), with the maximum information amount of the signals received by the three coil units and outputting the CP signal, and taking the signal at the (4K+3)th sampling point as a merging signal (e.g., ACP signal), with the minimum information amount of the signals received by the three coil units and outputting the ACP signal. K is an integer greater than or equal to 0.

The magnetic resonance imaging system includes a magnetic resonance signal receiving system in any of the above particular implementations.

Since the present embodiments perform low noise amplification, filtering and frequency mixing on the signals received by a plurality of coil units, intermediate frequency signals borne on different carrier frequencies of an identical channel are obtained. After amplification and filtering, the path of intermediate frequency signals is outputted to an analog-to-digital conversion unit to perform digital sampling, thus decreasing the number of ADCs. Since ADCs are not required to perform time-division multiplexing on a plurality of paths of signals, full advantage of the sampling rate of the ADC is taken.

In addition, since the coil units in a coil array are grouped according to the dynamic range of an ADC and the signal receiving situation of the coil units in the receiving coil array, the dynamic range of the ADC is taken full advantage of, and overflow of the dynamic range of the ADC will not occur.

Additionally, further implementing a part of the functions of an MoM using software may reduce the subsequent data processing amount.

DETAILED DESCRIPTION OF THE DRAWINGS

Figure 1:
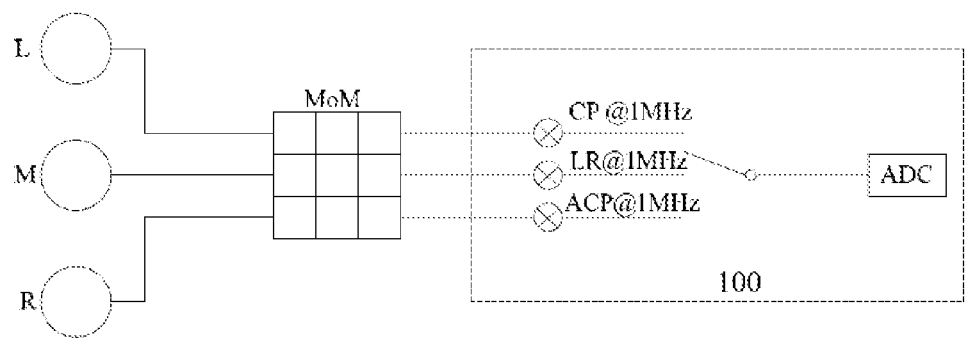
FIG. 1 is a schematic diagram of signal flow of a method for receiving a magnetic resonance signal.

FIG. 1 is a schematic diagram of exemplary signal flow of a method for receiving a magnetic resonance signal in a known application. As shown in FIG. 1, in some receiving coil arrays, coil units may be pre-divided into a plurality of coil unit groups by way of trinity, performing a mode matrix (MoM) operation on magnetic resonance signals received by three coil units (e.g., coil unit L, coil unit M and coil unit R as shown in FIG. 1) of each coil unit group to obtain three paths of signals (e.g., a merging signal with the maximum information amount of the signals received by the three coil units (a CP signal), a merging signal with a minimum information amount of the signals received by the three coil units (e.g., an ACP signal), and a merging signal with a relatively small information amount of the signals received by the three coil units (e.g., an LR signal)). Low noise amplification, filtering and frequency mixing are respectively performed on each path of signals of the three paths of signals. After amplifying and filtering the frequency mixed signals, a receiver 100 outputs the frequency mixed signals to the ADC thereof, where the ADC performs digital sampling on the three paths of signals via time-division multiplexing (TDM). If a compression unit is also included in the receiver 100, then compression may be further performed on the filtered signals before outputting the filtered signals to the ADC.

This method may decrease the number of ADCs to some degree, but since the ADC performs digital sampling on the three paths of signals via time-division multiplexing, it is equivalent to reducing the sampling rate of the ADC for each path of signals.

In one embodiment, in order to decrease the number of ADCs and not reduce the sampling rate of the ADC, low noise frequency mixing may be performed on the signals received by a plurality of coil units, thus obtaining intermediate frequency signals borne on different carrier frequencies on an identical channel. The path of intermediate frequency signals is output after amplification and filtering to the analog-to-digital conversion unit to perform digital sampling.

A plurality of coil units only needs to correspond to one ADC, and therefore the number of ADCs is decreased by multiples. Accordingly, a series of other elements of a digital receiver system may be decreased correspondingly, thus reducing the system costs.

The carrier frequencies that bear the signals received by each coil unit may be pre-determined. Thus, when performing low noise frequency mixing, the signals received by the plurality of coil units may be borne on the corresponding carrier frequencies of an identical channel according to the determined correlations between the signals and the carrier frequencies, so as to parse each corresponding signal according to the correlations when subsequently performing down-conversion. The correlations between the signals and the carrier frequencies are not changeless, but may be pre-configured in coil files, as required.

Additionally, since the dynamic ranges of the magnetic resonance signals outputted by different coil units are different, for example, the dynamic ranges of the magnetic resonance signals of a single coil unit may be wide or narrow, and the dynamic ranges of the signals after MoM processing are wide or narrow as well. For example, a CP signal may have the widest dynamic range. An LR signal has a relatively narrow dynamic range, while an ACP signal has the narrowest dynamic range. Therefore, in order to meet the dynamic range requirements of various signals in practical applications, a receiver may be configured to meet the requirement of the maximum signal dynamic range. The dynamic range may be the power difference between the maximum signal power and the noise power, which is in dB. The dynamic range of the receiver may be determined by the dynamic range of the ADC. If the receiver also includes a compression unit that compresses the received signals, then the dynamic range of the receiver may be co-determined by the ADC and the compression unit. For example, the dynamic range may be the product of the dynamic range of the ADC and the compression factor of the compression unit.

Thus, for coil units that output signals with a low dynamic range, the dynamic range of the receiver may not be taken full advantage of, resulting in resource waste to some extent.

The coil units in a coil array may be grouped according to the dynamic range of the receiver and the signal receiving situation of the coil units in the coil array. For example, the coil units in a coil array may be grouped by following the principle that the dynamic range of the receiving signals of each group of coil units is not greater than the dynamic range of the receiver, but may be approximated to the dynamic range of the receiver as much as possible. For example, for coil units that output signals with a lower dynamic range, more coil units may be divided into one coil unit group. For coil units that output signals with a higher dynamic range, fewer coil units (even one coil unit) may be divided into one coil unit group. Thus, not only may the dynamic range of the receiver be taken full advantage of, but also the grouping of the coil units is more flexible without the need for dividing three coil units into one group as with the coil units with MoM. Additionally, exceeding the dynamic range of the receiver will not occur.

The present embodiments are further described in detail hereinafter.

Figure 2:
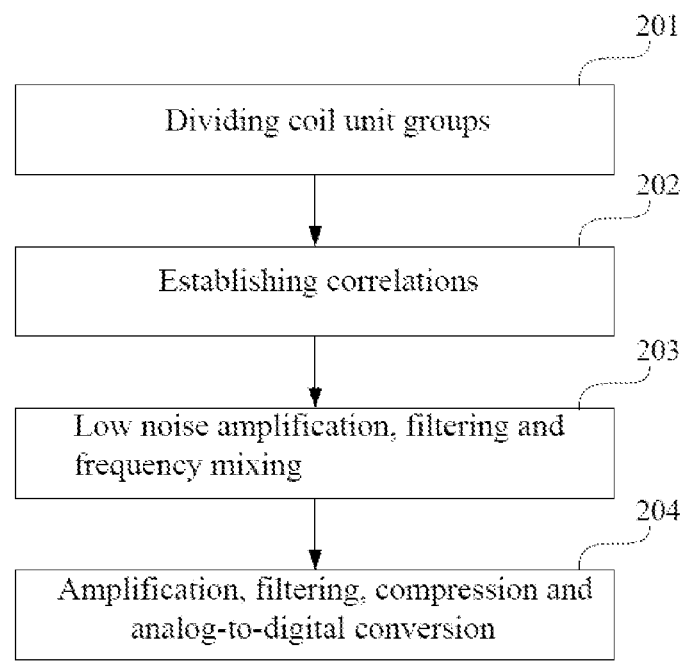
FIG. 2 is an exemplary flowchart of one embodiment of a method for receiving magnetic resonance signals.
Figure 3:
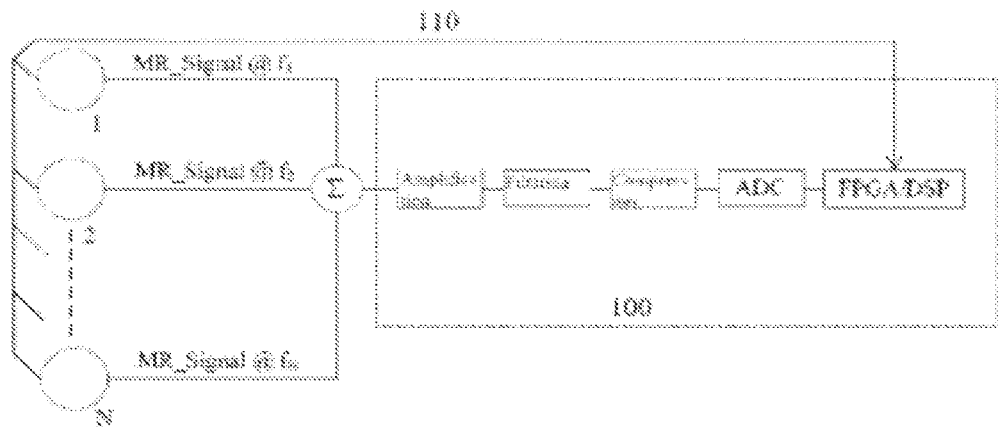
FIG. 3 is a schematic diagram of exemplary signal flow in an example corresponding to the receiving method shown in FIG. 2.

FIG. 2 is an exemplary flowchart of one embodiment of a method for receiving magnetic resonance signals. FIG. 3 is a schematic diagram of signal flow in an example corresponding to the receiving method shown in FIG. 2. As shown in FIGS. 2 and 3, the method includes the following acts.

In act 201, the coil units in a receiving coil array are pre-divided into different coil unit groups.

In the present embodiment, either the method of grouping coil units with MoM in a receiving coil array may be applied (e.g., each three coil unit is divided into one group), or coil units are grouped in a receiving coil array according to the dynamic range of the receiver and the signal receiving situation of the coil units in the receiving coil array. For example, in order to take full advantage of the dynamic range of the receiver, the coil units in a coil array may be grouped by following the principle that the dynamic range of the receiving signals of each group of coil units is not greater than the dynamic range of said receiver, but may be approximated to the dynamic range of the receiver as much as possible. In the situation where each coil unit group meets the grouping requirements at this moment, any number of coil units may be included and not limited to three coil units.

According to the current signal receiving situation of the coil units in the receiving coil array and the parameter design of the receiver, all the coil units of an identical orthogonal signal may be divided into an identical group. Such a grouping method may meet the requirement that the dynamic range of the receiving signals of each coil unit group in a coil unit group is not greater than the dynamic range of the receiver.

The following acts are performed on each coil unit group:

In act 202, the correlations between carrier frequencies and the signals received by each coil unit in the coil unit group are established.

In practical applications, the correlations may be pre-stored in coil files. The correlations are not changeless, but the coil files may be configured arbitrarily as required, thus improving the flexibility of the system.

In act 203, after performing low noise amplification and anti-aliasing filtering on the signals received by all the coil units in the coil unit group, frequency mixing is performed on the anti-aliasing filtered signals according to the correlations to obtain the intermediate frequency signals borne on the respectively corresponding carrier frequencies of an identical channel.

In act 204, the intermediate frequency signals are outputted to an ADC after amplifying and filtering so as to perform digital sampling to obtain digital domain signals. In other embodiments, after amplifying and filtering the intermediate frequency signals and before outputting the intermediate frequency signals to the ADC to perform digital sampling, the filtered signals may be further compressed using a compression unit, and then outputted to the ADC to perform digital sampling.

Down-conversion processing may be performed on the digital domain signals using a digital processing unit such as a DSP or an FPGA etc., according to the correlations.

Considering that the data amount of subsequent processing may be reduced after a receiving coil matrix with MoM generates CP signals, ACP signals and LR signals, the present embodiments may implement a part of the functions of the MoM above using software regarding the coil unit group including three coil units. For example, in act 203, the frequencies of the required local oscillator signals during frequency mixing are selected to make the frequencies of the frequency mixed intermediate frequency signals meet the following relationship: $f_L=f_M+f_s/4$, $f_R=f_M-f_s/4$.

$f_s$ is the sampling rate of an ADC; $f_M$ is the frequency of the intermediate frequency signal of the coil unit M located in the middle of three coil units; $f_L$, is the frequency of the intermediate frequency signal of the coil unit L located in the left of three coil units; and $f_R$ is the frequency of the intermediate frequency signal of the coil unit R located in the right of three coil units.

For example, the sampling rate of the ADC may be 40 MHz, and $f_M$ may be 12.5 MHz. Then, $f_L$, may be 22.5 MHz, and $f_R$ may be 2.5 MHz.

Frequency mixing is performed on all the signals received by the group of coil units using the local oscillator signals with the selected frequencies.

After act 204, sampling may be performed on the digital domain signals using a digital processing unit such as a DSP or an FPGA, etc. At each sampling point N, the phase relationships of the digital domain signals corresponding to the three coil units M, L and R are shown in Table 1.

TABLE 1

| N | 0 | 1 | 2 | 3 | 4 | 5 |
|---|---|---|---|---|---|---|
| M | 0 | 0 | 0 | 0 | 0 | 0 |
| L | 0 | π/2 | π | π*3/2 | 0 | π/2 |
| R | 0 | −π/2 | −π | −π*3/2 | 0 | −π/2 |

Therefore, the signal at the (4K+1)th sampling point may be obtained as a merging signal with the maximum information amount of the signals received by the three coil units (e.g., a CP signal). The signal at the (4K+3)th sampling point may be obtained as a merging signal with the minimum information amount of the signals received by the three coil units (e.g., an ACP signal. K=0, 1, 2, 3, . . . ).

The method for receiving magnetic resonance signals is described above in detail, and a corresponding system for receiving magnetic resonance signals is described in detail hereinafter.

Figure 4:
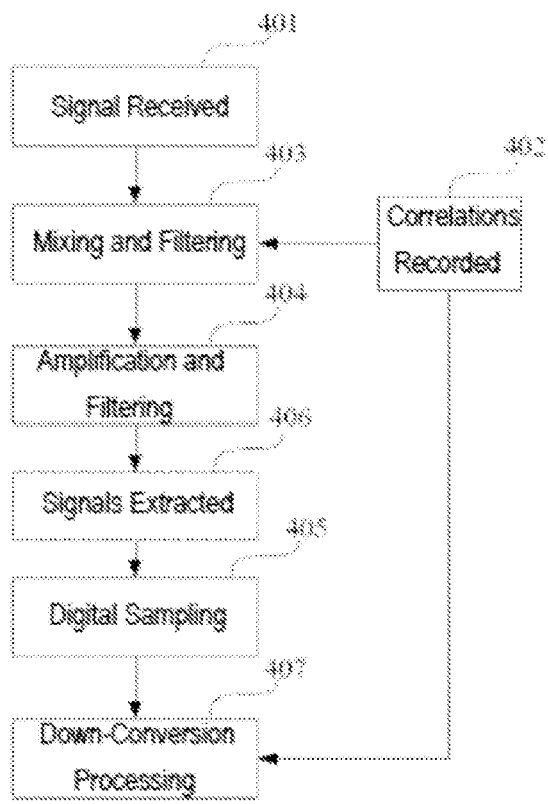
FIG. 4 is an exemplary structure chart of one embodiment of a system for receiving magnetic resonance signals.

FIG. 4 is one embodiment of a system for receiving a magnetic resonance signal including a receiving coil array 401, a correlation recording unit 402, a low noise frequency mixing unit 403, an amplification and filtering unit 404 and an analog-to-digital conversion unit 405. As shown in the dotted part in FIG. 4, during a particular implementation, the receiving system may further include a compression unit 406 between the amplification and filtering unit 404 and the analog-to-digital conversion unit 405. In practical applications, the amplification and filtering unit 404, the analog-to-digital unit 405 and the compression unit 406 may be located in a receiver.

The receiving coil array 401 includes at least one coil unit group. During particular implementation, the coil unit groups may be divided according to the dynamic range of the analog-to-digital unit 405 (or the dynamic range co-determined by the analog-to-digital conversion unit 405 and the compression unit 406) and the signal receiving situation of the coil units in the receiving coil array. For example, each coil unit group includes coil units with the dynamic range of the total receiving signals being not greater than the dynamic range of the analog-to-digital unit 405 but may be approximated to the dynamic range of the analog-to-digital unit 405 as much as possible. Alternatively, each coil unit group includes coil units with the dynamic range of the total receiving signals being not greater than the dynamic range co-determined by the analog-to-digital unit 405 and the compression unit 406 but may be approximated to the dynamic range co-determined by the analog-to-digital unit 405 and the compression unit 406 as much as possible. During particular implementation, each coil unit group may include all the coil units that receive an identical orthogonal signal.

The correlation recording unit 402 is used for recording the correlations between carrier frequencies and the signals received by each coil unit in a corresponding coil unit group.

The low noise amplification, filtering and frequency mixing unit 403 is used for performing frequency mixing on the anti-aliasing filtered signals according to the correlations recorded by the correlation recording unit after performing low noise amplification and anti-aliasing filtering on the signals received by all the coil units in the coil unit group to obtain intermediate frequency signals borne on the respectively corresponding carrier frequencies of an identical channel.

The amplification and filtering unit 404 is used for performing amplification and filtering processing on the intermediate frequency signals.

The compression unit 406 is used for compressing the signals from the amplification and filtering unit 404, and outputting the compressed signals to the analog-to-digital conversion unit 405.

The analog-to-digital conversion unit 405 is used for performing digital sampling on the signals after being processed by the amplification and filtering unit 404 or used for performing digital sampling on the signals after being compressed by the compression unit 406 to obtain digital domain signals.

Furthermore, the system may also include a digital processing unit 407. The digital processing unit 407 may be used for performing down-conversion processing on the digital domain signals according to the correlations recorded by the correlation recording unit.

In addition, corresponding to the method shown in FIG. 2, for coil unit groups that include three coil units, in the present system, a local oscillator signal frequency determination unit (now shown in the figures) used for selecting the frequencies of the required local oscillator signals during frequency mixing to make the frequencies of the frequency mixed intermediate frequency signals meet the following relationship: $f_L=f_M+f_s/4$, $f_R=f_M-f_s/4$ may be further included.

$f_s$ is the sampling rate of an analog-to-digital converter; $f_M$ is the frequency of the intermediate frequency signal of the coil unit located in the middle of three coil units; $f_L$, is the frequency of the intermediate frequency signal of the coil unit located in the left of three coil units; and $f_R$ is the frequency of the intermediate frequency signal of the coil unit located in the right of three coil units.

The low noise amplification, filtering and frequency mixing unit 403 may perform frequency mixing on all the signals received by the group of coil units using the local oscillator signals with the selected frequencies.

The digital processing unit 406 is used for extracting the digital domain signals: taking the signal at the (4K+1)th sampling point as a merging signal (e.g., CP signal), with the maximum information amount of the signals received by the three coil units and outputting the merging signal, and taking the signal at the (4K+3)th sampling point as a merging signal (e.g., ACP signal), with the minimum information amount of the signals received by the three coil units and outputting the merging signal. K is an integer greater than or equal to 0.

The magnetic resonance imaging system in the embodiments may include a magnetic resonance signal receiving system in any of the above particular implementations.

A receiving method and receiving system for magnetic resonance signals, and a magnetic resonance imaging system are provided. The method optionally includes dividing the coil units in a receiving coil array into different coil unit groups; for each coil unit, establishing correlations between carrier frequencies and the signals received by each coil unit in the coil unit group; performing low noise amplification, filtering and frequency mixing on the signals received by all the coil units in the coil unit group according to the correlations to obtain intermediate frequency signals borne on the respectively corresponding carrier frequencies of an identical channel; and after performing amplification and filtering on the intermediate frequency signals, outputting the intermediate frequency signals to an analog-to-digital conversion unit to perform digital sampling so as to obtain digital domain signals. This may decrease the number of ADCs in case of taking full advantage of the sampling rate of the ADC.

What are described above are merely embodiments and are not to limit the present invention. Any modifications, equivalents and improvements within the spirit and principle of the present invention are to be covered by the scope of protection of the present invention.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A system for receiving magnetic resonance signals, the system comprising:
   a receiving coil array comprising at least one coil unit group;
   a correlation recording unit configured to record correlations between carrier frequencies and signals received by each coil unit in a corresponding coil unit group of the at least one coil unit group;
   a low noise amplification, filtering and frequency mixing unit configured to perform frequency mixing on anti-aliasing filtered signals according to the correlations recorded by the correlation recording unit after performing low noise amplification and anti-aliasing filtering on the signals received by the coil units in the at least one coil unit group to obtain intermediate frequency signals borne on the respectively corresponding carrier frequencies of one channel;
   an amplification and filtering unit configured to perform amplification and filtering processing on the intermediate frequency signals; and
   an analog-to-digital conversion unit configured to perform digital sampling on the signals processed by the amplification and filtering unit to obtain digital domain signals,
   wherein the at least one coil unit group comprises three coil units,
   wherein the system further comprises a local oscillator signal frequency determination unit and a digital processing unit configured to select frequencies of required local oscillator signals during frequency mixing to make frequencies of the frequency mixed intermediate frequency signals meet the following relationship: $f_L = f_M + f_s/4$, $f_R = f_M - f_s/4$,
   wherein $f_s$ is a sampling rate of the analog-to-digital conversion unit, $f_M$ is a frequency of the intermediate frequency signal of the coil unit located in the middle of the three coil units, $f_L$ is the frequency of the intermediate frequency signal of the coil unit located in the left of the three coil units, and $f_R$ is a frequency of the intermediate frequency signal of the coil unit located in the right of the three coil units,
   wherein the low noise amplification, filtering and frequency mixing unit is configured to perform frequency mixing on all the signals received by the at least one group of coil units using the local oscillator signals with the selected frequencies, and
   wherein the digital processing unit is configured to extract the digital domain signals, taking a signal at a (4K+1)th sampling point as a merging signal with a maximum information amount of the signals received by the three coil units and outputting the signal at the (4K+1)th sampling point, and taking a signal at a (4K+3)th sampling point as a merging signal with a minimum information amount of the signals received by the three coil units and outputting the signal at the (4K+3)th sampling point, wherein K is an integer greater than or equal to 0.

2. The system as claimed in claim 1, wherein each of the at least one coil unit group in the receiving coil array comprises coil units with a dynamic range of total receiving signals being not greater than a dynamic range of the analog-to-digital conversion unit.

3. The system as claimed in claim 2, further comprising a digital processing unit configured to perform down-conversion processing on the digital domain signals according to the correlations recorded by the correlation recording unit.

4. The system as claimed in claim 1, further comprising a compression unit located between the amplification and filtering unit and the analog-to-digital conversion unit, wherein the compression unit is configured to compress on signals from the amplification and filtering unit.

5. The system as claimed in claim 4, wherein each of the at least one coil unit group in the receiving coil array comprises coil units with a dynamic range of total receiving signals being not greater than a dynamic range co-determined by the analog-to-digital conversion unit and the compression unit.

6. The system as claimed in claim 5, further comprising a digital processing unit configured to perform down-conversion processing on the digital domain signals according to the correlations recorded by the correlation recording unit.

7. The system as claimed in claim 4, wherein each of the at least one coil unit group in the receiving coil array comprises all the coil units that receive an identical signal.

8. The system as claimed in claim 4, further comprising a digital processing unit configured to perform down-conversion processing on the digital domain signals according to the correlations recorded by the correlation recording unit.

9. The system as claimed in claim 1, wherein each of the at least one coil unit group in the receiving coil array comprises all the coil units that receive an identical signal.

10. The system as claimed in claim 1, further comprising a digital processing unit configured to perform down-conversion processing on the digital domain signals according to the correlations recorded by the correlation recording unit.

11. A magnetic resonance imaging system comprising:
a magnetic resonance signal receiving system comprising:
- a receiving coil array comprising at least one coil unit group;
- a correlation recording unit configured to record correlations between carrier frequencies and signals received by each coil unit in a corresponding coil unit group of the at least one coil unit group;
- a low noise amplification, filtering and frequency mixing unit configured to perform frequency mixing on anti-aliasing filtered signals according to the correlations recorded by the correlation recording unit after performing low noise amplification and anti-aliasing filtering on the signals received by the coil units in the at least one coil unit group to obtain intermediate frequency signals borne on the respectively corresponding carrier frequencies of one channel;
- an amplification and filtering unit configured to perform amplification and filtering processing on the intermediate frequency signals; and
- an analog-to-digital conversion unit configured to perform digital sampling on the signals processed by the amplification and filtering unit to obtain digital domain signals, wherein the at least one coil unit group comprises three coil units,
wherein the system further comprises a local oscillator signal frequency determination unit and a digital processing unit configured to select frequencies of required local oscillator signals during frequency mixing to make frequencies of the frequency mixed intermediate frequency signals meet the following relationship:
$f_L = f_M + f_s/4$, $f_R = f_M - f_s/4$,
wherein $f_s$ is a sampling rate of the analog-to-digital conversion unit, $f_M$ is a frequency of the intermediate frequency signal of the coil unit located in the middle of the three coil units, $f_L$ is the frequency of the intermediate frequency signal of the coil unit located in the left of the three coil units, and $f_R$ is a frequency of the intermediate frequency signal of the coil unit located in the right of the three coil units,
wherein the low noise amplification, filtering and frequency mixing unit is configured to perform frequency mixing on all the signals received by the at least one group of coil units using the local oscillator signals with the selected frequencies, and
wherein the digital processing unit is configured to extract the digital domain signals, taking a signal at a (4K+1)th sampling point as a merging signal with a maximum information amount of the signals received by the three coil units and outputting the signal at the (4K+1)th sampling point, and taking a signal at a (4K+3)th sampling point as a merging signal with a minimum information amount of the signals received by the three coil units and outputting the signal at the (4K+3)th sampling point, wherein K is an integer greater than or equal to 0.

12. A method for receiving magnetic resonance signals, the method comprising:
- after performing low noise amplification and anti-aliasing filtering on signals received by coil units in a coil unit group, performing frequency mixing on the anti-aliasing filtered signals according to correlations between carrier frequencies and the signals received by each coil unit in the coil unit group to obtain intermediate frequency signals borne on the respectively corresponding carrier frequencies of one channel; and
- after amplifying and filtering the intermediate frequency signals, outputting the amplified and filtered intermediate frequency signals to an analog-to-digital conversion unit to perform digital sampling so as to obtain digital domain signals, wherein the coil unit group comprises three coil units,
wherein the method further comprises, before performing frequency mixing on the anti-aliasing filtered signals, selecting frequencies of required local oscillator signals to make frequencies of the frequency mixed intermediate frequency signals meet the following relationship:
$f_L = f_M + f_s/4$, $f_R = f_M - f_s/4$,
wherein $f_s$ is a sampling rate of an analog-to-digital converter, $f_M$ is a frequency of the intermediate frequency signal of the coil unit located in the middle of the three coil units, $f_L$ is a frequency of the intermediate frequency signal of the coil unit located in the left of the three coil units, and $f_R$ is a frequency of the intermediate frequency signal of the coil unit located in the right of the three coil units,
wherein the frequency mixing comprises performing frequency mixing on the anti-aliasing filtered signals using the local oscillator signals with the selected frequencies, and
wherein the method further comprises, after the obtaining of the digital domain signals, extracting the digital domain signals, taking a signal at a (4K+1)th sampling point as a merging signal with a maximum information amount of the signals received by the three coil units and outputting the merging signal with the maximum information amount, and taking a signal at a (4K+3)th sampling point as a merging signal with a minimum information amount of the signals received by the three coil units and outputting the merging signal with the minimum information amount, wherein K is an integer greater than or equal to 0.

13. The method as claimed in claim 12, further comprising, before the outputting of the amplified and filtered intermediate frequency signals to the analog-to-digital conversion unit to perform digital sampling, compressing on the filtered signals using a compression unit, and outputting the compressed signals to the analog-to-digital conversion unit to perform digital sampling.

* * * * *